(12) United States Patent
Janssen et al.

(10) Patent No.: US 11,551,906 B1
(45) Date of Patent: Jan. 10, 2023

(54) TIME-GATED DETECTION, DUAL-LAYER SPAD-BASED ELECTRON DETECTION

(71) Applicant: FEI Company, Hillsboro, OR (US)

(72) Inventors: Bart Jozef Janssen, Lent (NL); Gerard van Veen, Riethoven (NL); Erik Kieft, Eindhoven (NL)

(73) Assignee: FEI Company, Hillsboro, OR (US)

( * ) Notice: Subject to any disclaimer, the term of this patent is extended or adjusted under 35 U.S.C. 154(b) by 9 days.

(21) Appl. No.: 17/364,621

(22) Filed: Jun. 30, 2021

(51) Int. Cl.
*H01J 37/244* (2006.01)
*H01J 37/04* (2006.01)
*H01J 37/26* (2006.01)

(52) U.S. Cl.
CPC .......... *H01J 37/244* (2013.01); *H01J 37/045* (2013.01); *H01J 37/26* (2013.01); *H01J 2237/2441* (2013.01); *H01J 2237/2445* (2013.01)

(58) Field of Classification Search
CPC ........ H01J 37/244; H01J 37/045; H01J 37/26; H01J 2237/2441; H01J 2237/2445
See application file for complete search history.

(56) References Cited

U.S. PATENT DOCUMENTS

| | | | | |
|---|---|---|---|---|
| 7,301,263 | B2* | 11/2007 | Maldonado | H01J 37/073 313/104 |
| 9,368,321 | B1* | 6/2016 | Randolph | G02B 21/0032 |
| 11,422,235 | B2* | 8/2022 | Huwer | G01S 7/4814 |
| 2008/0156993 | A1* | 7/2008 | Weinberg | G01T 1/1615 250/370.06 |
| 2008/0210869 | A1* | 9/2008 | Gerritsen | H01J 37/226 250/311 |
| 2010/0214654 | A1* | 8/2010 | Birk | G01J 1/46 250/214 R |
| 2011/0007869 | A1* | 1/2011 | Gendreau | G01N 23/20 378/46 |
| 2011/0049365 | A1* | 3/2011 | Aebi | H01L 27/14643 250/332 |
| 2012/0025074 | A1* | 2/2012 | Barbi | H01J 37/244 250/361 R |
| 2012/0265050 | A1* | 10/2012 | Wang | A61B 6/485 600/407 |
| 2014/0021346 | A1* | 1/2014 | Stoks | G01N 23/225 250/307 |
| 2014/0299751 | A1* | 10/2014 | Tang | B82Y 20/00 385/14 |

(Continued)

OTHER PUBLICATIONS

Arbouet et al., "Ultrafast transraission electron microscopy: historical development, instrumentation, and applications," *Advances in Imaging and Electron Physics*, vol. 207, pp. 1-72 (Jun. 25, 2018).

(Continued)

*Primary Examiner* — David A Vanore
(74) *Attorney, Agent, or Firm* — Klarquist Sparkman, LLP

(57) ABSTRACT

Electron beam modulation in response to optical pump pulses applied to a sample is measured using SPAD elements. Individual detection events are used to form histograms of numbers of events in time bins associated with pump pulse timing. The histograms can be produced at a SPAD array, simplifying data transfer. In some examples, two SPAD arrays are stacked and a coincidence circuit discriminates signal events from noise events by determining corresponding events are detected within a predetermined time window.

20 Claims, 9 Drawing Sheets

(56) References Cited

U.S. PATENT DOCUMENTS

| | | | | |
|---|---|---|---|---|
| 2016/0377675 | A1* | 12/2016 | Ukraintsev | G01R 31/311 |
| | | | | 324/754.23 |
| 2018/0136344 | A1* | 5/2018 | Nelson | A61B 6/037 |
| 2018/0145110 | A1* | 5/2018 | Zhao | G01J 5/061 |
| 2018/0172849 | A1* | 6/2018 | Nelson | G01T 1/2018 |
| 2018/0180670 | A1* | 6/2018 | Ramsay | G01J 5/0096 |
| 2021/0154497 | A1* | 5/2021 | Friedman | A61N 5/1045 |
| 2022/0208510 | A1* | 6/2022 | Janssen | H01J 37/244 |

OTHER PUBLICATIONS

Gnocchi et al., "Digital silicon photomultipliers with OR/XOR pulse combining techniques," *IEEE Transactions on Electron Devices*, vol. 63, No. 3, pp. 1105-1110 (Jan. 26, 2016).

Gupta et al., "Asynchronous single-photon 3D imaging," *Proceedings of the IEEE/CVF international Conference on Computer Vision*, pp. 7909-7918 (Oct. 27-Nov. 2, 2019).

Hadfield, "Single-photon detectors for optical quantum information applications," *Nature Photonics*, vol. 3, No. 12, pp. 696-705 (Nov. 30, 2009).

Hutchings et al., "A reconfigurable 3-D-stacked SPAD imager with in-pixel histogramming for flash LIDAR or high-speed time-of-flight imaging," *IEEE Journal of Solid-State Circuits*, vol. 54, No. 11, pp. 2947-2956 (Sep. 25, 2019).

Kostoulas, "Geiger-mode LiDAR—the Dawn of Digital Mapping," *International Society for Photogrammetry and Remote Sensing IGTF 2017 Conference*, retrieved from https://www.asprs.org/a/publications/proceedings/IGTF2017/Kostoulas_28.pdf, 29 pages (Mar. 12-16, 2017).

Van der Veen et al., "Ultrafast core-loss spectroscopy in four-dimensional electron microscopy," *Structural Dynamics*, vol. 2, No. 2, pp. 024302-1-024302-12 (Apr. 28, 2015).

Yurtsever et al., "Kikuchi ultrafast nanodiffraction in four-dimensional electron microscopy," *Proceedings of the National Academy of Sciences*, vol. 108, No. 8, pp. 3152-3156 (Feb. 22, 2011).

Zhao et al., "Development of a fast plastic scintillation detector with time resolution of less than 10 ps," *Nuclear Instruments and Methods in Physics Research A*, retrieved from arXiv:1602.00944, 16 pages (Jan. 30, 2016).

* cited by examiner

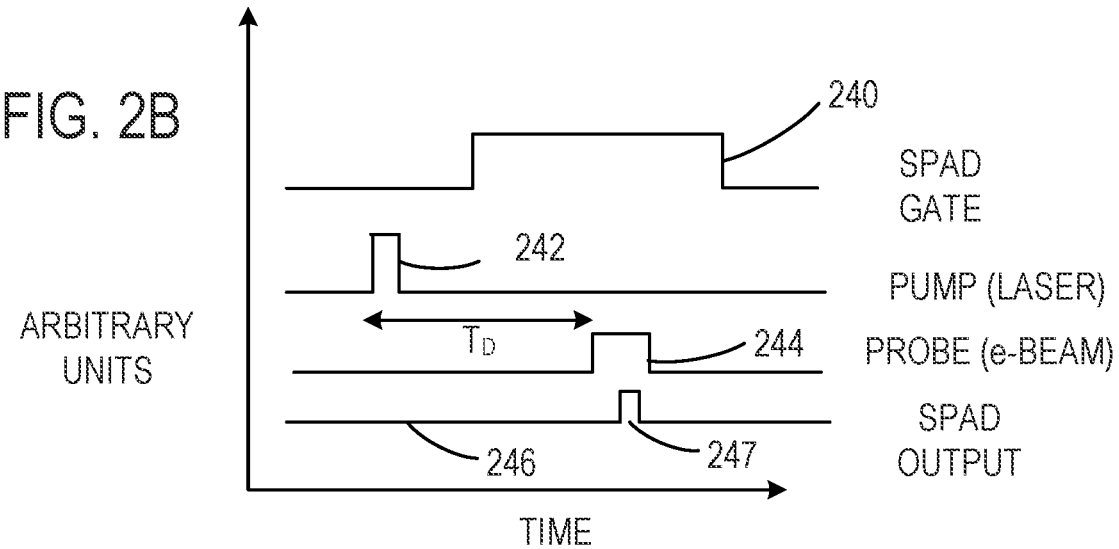

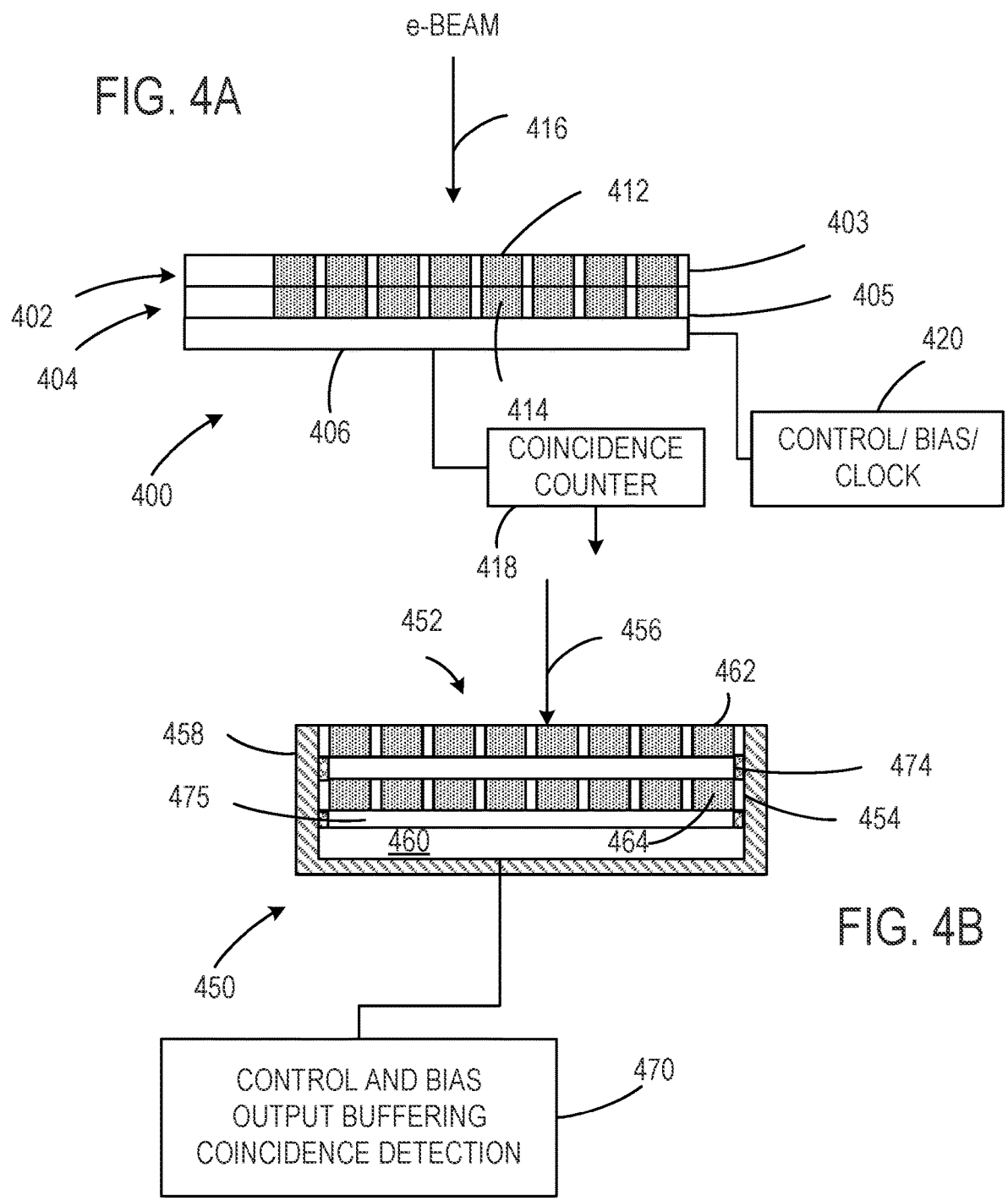

TIME-GATED DETECTION, DUAL-LAYER SPAD-BASED ELECTRON DETECTION

FIELD

The disclosure pertains to time-resolved electron microscopy.

BACKGROUND

Conventional time-resolved electron microscopy revolves around synchronizing a pump pulse such as a laser pulse, a microwave pulse, a temperature pulse, a mechanical or other excitation to start a sample probing process. Typically, the pump pulse is directed to a sample to interact with the sample and initiate a sample response. A probe pulse is then directed to the pumped sample and response to the probe pulse is measured. Temporal response can be obtained by varying the temporal delay of the probe pulse with respect to the pump pulse. The probe pulse can be an electron beam pulse produced in response to the pump laser, often by frequency doubling the pump pulse, and generating an electron beam pulse in response to the frequency doubled pump pulse. Pulse/probe pulses are repeated to permit increasing signal-to-noise ratio and varying the pulse/probe temporal delay permits reconstruction of sample temporal response. These pump/probe measurements can require lengthy acquisition times to provide adequate signal-to-noise ratio. In addition, the electron beam modulation and associated temporal delay complicate measurement setup.

Certain electron detectors can provide high temporal resolution but exhibit high noise so that signal to noise ratios are low. For example, single photon avalanche detectors (SPADs) can produce an avalanche-based output signal in response to a single electron. Unfortunately, SPADs also produce output signals (dark counts) in the absence of electron beam input. These dark counts can be reduced by SPAD cooling but cannot be distinguished from real signal.

In view of the above, alternatives to conventional pump/probe measurement approaches are needed as well as alternative detector configurations.

SUMMARY

Charged particle (CP) detectors comprise a first single photon detector (SPD) array and a second SPD array, aligned with respect to the first SPD array along a CP beam axis. A coincidence detector is secured to one of the first SPD array and the second SPD array and operable to indicate detection events corresponding to detection of a charged-particle in corresponding SPD array elements of the first SPD array and the second SPD array within a predetermined time window. In some examples, the first SPD array and the second SPD array are defined on a first substrate and a second substrate, respectively, and the first substrate is fixed with respect to the second substrate. In further example, the first substrate and the second substrate are semiconductor substrates in which SPD array elements of the first SPD array and the second SPD array, respectively, are defined, and the first SPD and the second SPD are single photon avalanche detectors (SPADs). In typical examples, the coincidence detector includes a corresponding coincidence detector element for each pair of corresponding SPD array elements of the first SPD array and the second SPD array. In some cases, the first SPD array and the second SPD array include different numbers of SPD elements, wherein the coincidence detector is configured to indicate detection events in response to detection of a charged particle in at least one SPD element of the first SPD array and at least one SPD element of the second SPD array. The coincidence detector can be defined on a third substrate that is secured to at least one of the first substrate and the second substrate. In other examples, a frame is situated to align the first SPD array and the second SPD array and at least one spacer is situated to define a separation of the first SPD array and the second SPD array. The first SPD array and the second SPD array can be defined on a first and a second substrate, respectively, and the first substrate can be fixed with respect to the second substrate. A third substrate is coupled to the first SPD array and the second SPD array to receive detection events from the first SPD array and the second SPD array and produce a time stamp associated with each received detection event for a plurality of corresponding SPD array elements of the first SPD array and the second SPD array. In some examples, the third substrate is coupled to the first SPD array and the second SPD array to receive detection events from the first SPD array and the second SPD array and produce histograms of detection events for a plurality of corresponding SPD array elements of the first SPD array and the second SPD array. The first SPD and the SPD arrays can be single photon avalanche detector (SPAD) arrays.

Methods comprising, in an electron microscope, directing an electron beam to a sample and detecting events based on a modulation of the electron beam in response to corresponding pump beam pulses directed to the sample in a first single photon detector (SPD) array. The detected events are associated with time bins corresponding to elapsed times from application of the corresponding pump beam pulses. Typically, a histogram of numbers of the detected events is formed. In some embodiments, the electron beam is repetitively blanked for at least a portion of time intervals between corresponding pump beam pulses. The electron beam can be unblanked based on application of the pump pulses and in some examples, the electron beam is unblanked at a fixed time delay with respect to the pump beam pulses and the pump beam pulses and the electron beam blanking are applied at a fixed repetition frequency. The fixed repetition frequency can be between 100 Hz and 300 MHz and the electron beam can be repetitively blanked for an interval of at least 95% of a fixed period associated with the fixed repetition frequency.

According to representative embodiments, the first SPD array is a single photon avalanched detector (SPAD) array and, with a second SPAD array secured to the first SPAD array, it is determined if coincident events are detected corresponding to the events detected with the first SPAD array. A histogram is formed based on the coincident events, wherein a time bin for each coincident event is based on a time with respect to an associated pump beam pulse. In some examples, the first SPAD array and the second SPAD array are defined on a first and a second substrate, respectively, and the first substrate is fixed with respect to the second substrate, and a third substrate is coupled to the first SPAD array and the second SPAD array and is operable to produce histograms of detection events for a plurality of corresponding SPAD array elements of the first SPAD array and the second SPAD array.

The foregoing and other features, and advantages of the disclosed technology will become more apparent from the following detailed description, which proceeds with reference to the accompanying figures.

BRIEF DESCRIPTION OF THE DRAWINGS

FIG. 2B is a representative timing diagram associated with the system of FIG. 2A.

FIG. 4A illustrates a stacked SPAD assembly that includes first and second SPAD arrays defined on respective substrates such as wafers that are secured together.

FIG. 4B illustrates a stacked SPAD assembly that includes first and second SPAD arrays that are spaced apart.

DETAILED DESCRIPTION

Introduction

Figure 1A:
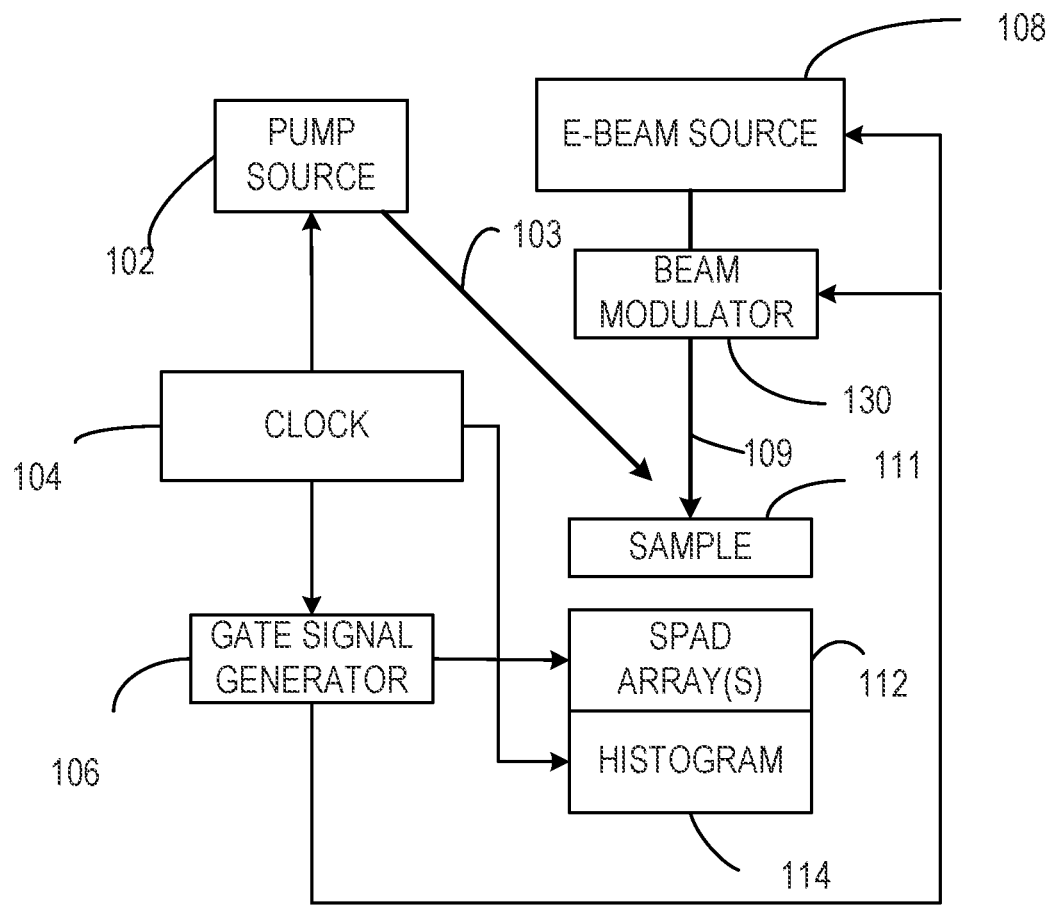
FIG. 1A illustrates a representative electron microscope system configured to use a pump beam and a single photon avalanche detector (SPAD) array.

Unlike conventional pump-probe methods used in electron microscopy, in the disclosed approaches, an electron beam need not be modulated, but a SPAD array and pump pulses are synchronized with a gating signal applied to the SPAD array. Time resolutions of 5-30 ps or better can be achievable, even with scintillator based detectors. The electron beam which serves as a probe beam can be left on as in conventional transmission electron microscopy or, alternatively, modulated at a slower timescale using an electrostatic blanker or other modulator, to reduce dose on the sample.

SPAD arrays can operate in histogramming mode in which detection events are added to a histogram as acquired so that storage and transmission of raw, individual arrival times is not needed. Such "in-pixel" histograms are based on event times relative to a gate pulse or other synchronization pulse that can be provided by a dedicated clock circuit or based on a repetition rate of the pump pulses. The data rate required to get the image off-chip is greatly is reduced since only summary statistics (such as histograms) are communicated, not individual event times.

In measurements in which only a fraction of probe beam electrons are captured by a detector such as (weak) diffraction or (core-loss) EELS, the disclosed approaches can provide a substantial increase in throughput even compared to conventional pump-probe techniques at similar time resolutions, with much reduced complexity. Increased throughput can lead to reduced total measurement time, and better sample survival under the multitude of pump pulses.

The examples below generally include arrays of single photon avalanche detectors (SPADs) based on semiconductors such as Si, Ge, InGaAs, or other materials. The disclosed arrangements are generally suited to detection of charged particles such as electrons that can be transmitted by one SPAD to another SPAD that is suitably aligned, but the disclosed approaches are suitable for other charged-particle beam beams. The disclosed approaches can also be used with, for example, measurements based on a short pump pulses and a continuous probe. The pump pulses can be optical or charged particle beam pulses, mechanical, temperature, or other excitations. In some examples below, one-dimensional SPAD arrays are shown for convenient illustration but two-dimensional SPAD arrays can also be provided in which SPAD elements arranged in N by M arrays, wherein N, M are positive integers, are stacked. In typical examples, each of the stacked SPADs has the same numbers (N by M) of SPAD elements, but different numbers can be used. In addition, the SPAD elements cam be semiconductor based devices but elements of other kinds can be used such as, for example, superconducting nanowire single photon detectors, photomultiplier tubes, microchannel plate photomultipliers, superconducting transition-edge sensors, and single photon quantum dot detectors. Detectors that operate in Geiger mode such as SPADs can be used with temporal histogramming as discussed below to record signal waveforms. Detectors that exhibit analog or other or non-Geiger responses can be used with histogramming as well, if suitably processed for histogramming. As used herein, single photon detector refers to a photon or charged particle detector that produces a Geiger-mode response to a single photon or charged particle. A Geiger mode response is substantially independent of a number of photons or charged particles detected. Such a response can be referred to as a binary response that varies from on to off.

SPAD elements produce an avalanche response in response to a received charged particle. Such responses are referred to herein as events or detection events. Such events can be used to reconstruct a temporal waveform by forming a histogram of numbers of events as a function of time. SPADs can be defined on substrates such as semiconductor substrates or defined as discrete devices that are then arranged and secured on a substrate for support. In typical examples, silicon substrates are used but SPAD elements can be defined in other semiconductors such as germanium and InGaAs.

In some examples disclosed herein, time resolution is determined by the SPAD elements, and a probe (electron) pulse can be almost arbitrarily long. However, probe pulse duration is generally limited to reduce dose and pile-up distortion due to SPAD element dead time but probe electron pulse duration and timing are less critical than in conventional pump-probe measurements. In conventional pump-probe measurements, time resolution is determined by probe pulse duration and measurement throughput is low.

In the examples, optical pump pulses are applied to a sample and modulation of an electron beam directed to the sample is detected with a SPAD array. Typically the electron beam is blocked or attenuated during at least some times intervals at which electron beam modulation by the sample in response to an optical pump pulse is not of interest, generally to reduce electron dose on a sample. As used herein, "blanking" or "beam blanking" refers to attenuating, blocking, or deflecting an electron beam in this way. Such blanking can be provided by modulation of an electron beam source or using one or more electron beam deflectors or other electron optic elements.

While the examples are generally directed to pump/probe measurements, the disclosed approaches can be used for temporal characterization of various electron beam modulation techniques, such as fast (electrostatic) beam blanking, RF chopped pulse trains, etc. and hence could be used to demonstrate and confirm the performance of such techniques. In this case, the SPAD is synchronized to a suitable output of the beam modulation technique rather than a pump source such as a pump laser.

Example 1

Referring to FIG. 1A, a representative measurement system 100 includes a pump source 102, typically an optical source that produces short pulses, such as pulses having durations less than 30 ns, 1 ns, 300 ps, 30 ps, 1 ps, or shorter. The optical source 102 can be a mode-locked laser that operates at a fixed repetition frequency or an optical source that generates pulses on demand at fixed, variable, or arbitrary rates and is situated to deliver an optical beam 103 to a sample 111. As shown in FIG. 1A, the pump source 102 can produce pulses in response to a clock signal generator 104 but in some examples, the pump source operates at a fixed frequency and this fixed frequency serves as a clock signal. A gate signal generator 106 is responsive to the clock signal and produces a gate signal that can be coupled to one or both of an electron beam source 108 and an electron beam deflector 130 to provide beam blanking or other electron beam modulation. The electron beam source 108 produces an electron beam that propagates along a beam axis 109 that is directed to the sample 111 and can be blanked to reduce beam dose.

The gate signal generator 106 is also coupled to one or more SPAD arrays 112 that produce detection events based on modulation of the electron beam in response to the pump pulses. In the example of FIG. 1A, processing circuitry 114 that produces histograms of detected events in time bins corresponding to elapsed time from application of pump pulses associated with the detected events. The gate signal generator 106 can operate at a fixed, variable, or random delay with respect to the clock signal from the clock signal generator 104.

Figure 1B:
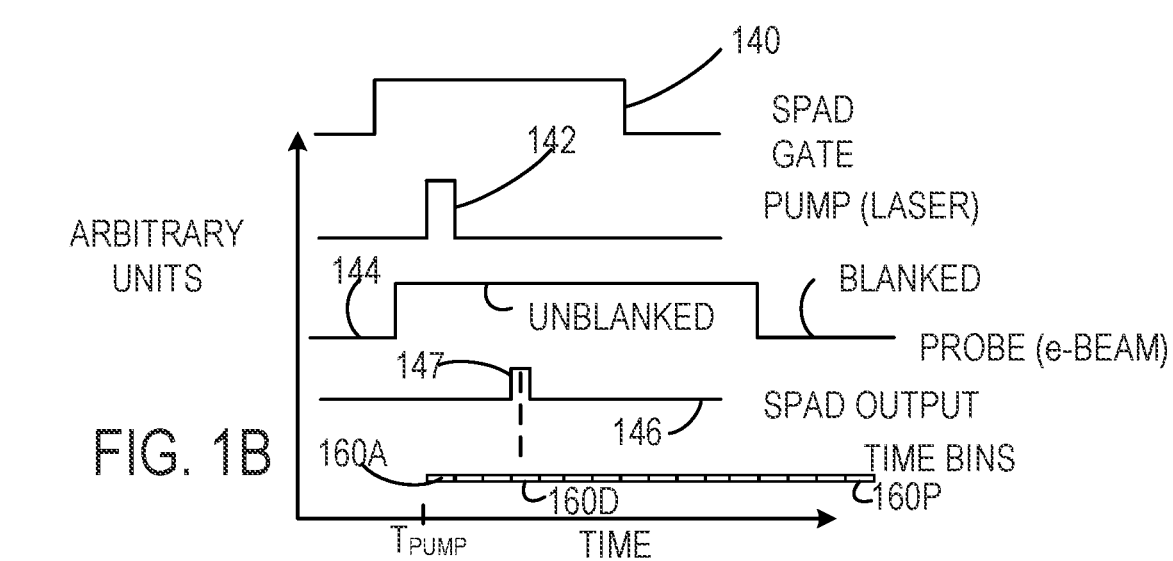
FIG. 1B is a representative timing diagram associated with the system of FIG. 1A.

As shown in FIG. 1B, the SPAD array 112 is gated to be in an on-state using a gating pulse 140 to measure probe pulse modulation in response to an optical pump pulse 142. The SPAD detector array 112 can produce output signals such as an output signal 146 that includes a detection event 147 at any element of the SPAD detector array 112. The SPAD detector array 112 operates in Geiger mode so that the amplitude of the detection event 147 is substantially independent of signal amplitude but the times at which detection events are produced (referred to as "arrival times") for a series of probe pulses can be used generate a histogram of arrival times. This histogram can be used to obtain a temporal response of the sample to the probe pulses. Relative signal timings can be set electronically by the gate signal generator 106 and the probe electron beam is blanked with a blanking signal 144 to reduce sample dose. As shown in FIG. 1B, events are assigned to one of time bins 160A-160P corresponding to detection times referenced to the timing of the associated pump pulse. The same time bins are used for all of the repetitive pump pulses, referenced to the timing of the associated pump pulse. More or fewer time bins can be used, and the time bins can have the same or different sizes. Pump pulses are repetitively applied so that the pulse sequences shown in FIG. 1B repeat so that many events can be detected and assigned to the time bins 160A-160P.

The beam deflector 130 can be controlled to deflect the electron beam until the pump pulse is applied. In this way, the SPAD array 112 and the sample 111 receive reduced electron beam dose as compared with use of an unmodulated electron beam. In addition, blanking the electron beam reduces pileup distortion that causes histograms produced with the SPAD array output signals to show response to the probe pulse with significantly reduced amplitude. For example, for an unblanked beam, a SPAD detector array element is likely to respond to electron beam portions unrelated to the response of the sample 110 to the pump pulse. Thus, a histogram of arrival times can be skewed to earlier histogram bins. Although not shown in FIG. 1B, after detection of an electron, a SPAD array element typically has a dead time that is typically between 30 ns and 1 µs so that response to the unblanked electron beam can increase dead-time and delay signal acquisition.

Pile-up distortion can be compensated or partially compensated digitally, by reducing electron current or changing the timing of the electron beam unblanking, i.e. after each pump pulse, unblanking the electron beam for only part of the time window of interest; then varying the unblanking interval between subsequent pump pulses. Varying SPAD gate timing can also be used with histogram time bin definitions remaining relative to the pump pulse and not relative to the SPAD gate.

Example 2

Figure 2A:
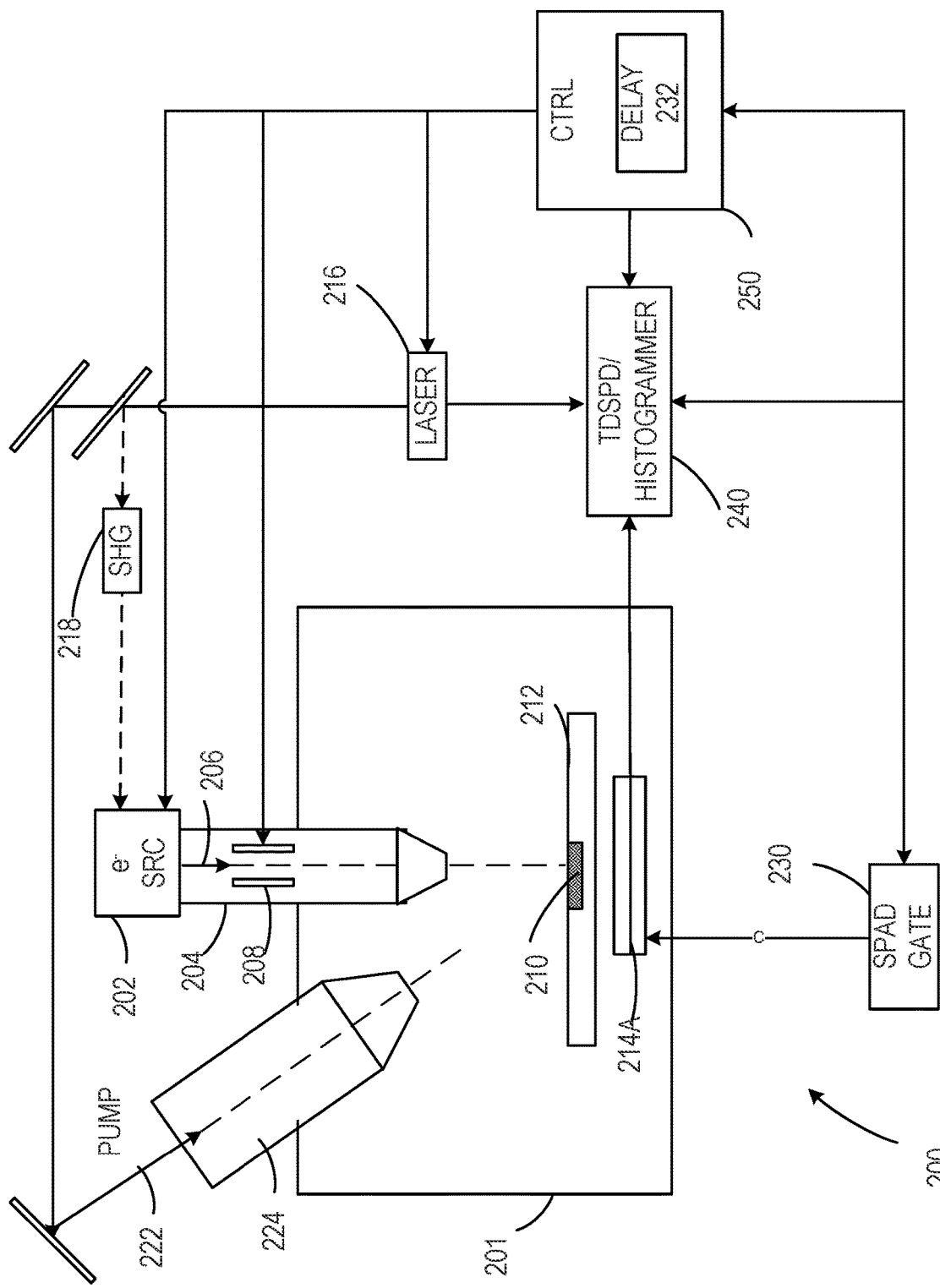
FIG. 2A illustrates a representative electron microscope system configured to use a pump beam, a SPAD array, and to blank and unblank a probe electron beam.

In another example illustrated in FIG. 2A, a pump beam and detector gating can operate asynchronously, and a probe electron beam can be unmodulated. However, typically a time window of interest is very short compared to a period between pump pulses and such asynchronous operation tends to be inefficient. To reduce pileup distortion, a SPAD gate can be varied within a duration of a beam-blanked or otherwise generated electron pulse.

The system 200 includes an electron beam source 202 that directs an electron beam 206 to a sample 210 via an electron-optical column 204. A beam blanker 208 can be used to reduce sample dose, if desired. The sample 210 can be situated on a sample stage 212 and electron beams portions from the sample are directed to a detector such as SPAD array 214A that can be coupled to a signal processor substrate 214B for processing SPAD array signals such as for time correlation and histogramming. A laser 216 directs a pulsed laser beam to a light optical system 224 that directs a pump beam 222 to the sample 210. In some alternatives, the electron beam 206 can be produced in response to the pulsed laser beam if desired, typically via a second harmonic generator 218 to increase laser photon energy. However, in typical examples, the electron beam 206 is modulated by modulation of the electron beam source 202 or with a beam deflector 208. As noted above, the electron beam 206 is modulated to reduce electron beam dose at the sample 210 outside of a time window of interest.

The SPAD array 214A is coupled to a gate generator 230 that receives a gate signal from a delay generator 232 that can activate the SPAD array 214A at random times or predetermined times associated with pump pulses. As shown, the delay generator is included in a controller 250 that also provides gate signals to one or more of the laser 216, the electron beam source 202 and/or the beam deflector 208. In some examples, the laser 216 provides pulses at a fixed frequency and gate signals are times based on the fixed frequency. SPAD array output signals are directed to a processor 240 for time correlation and time histogramming, but these operations can also be performed at the signal processor substrate 214B as well. In some examples, the controller 250 is coupled to the laser 216 to establish laser pulse characteristics such as pulse duration, repetition rate, and pulse energy.

As shown in FIG. 2B, the SPAD array 214A is gated to be in an on-state using a gating pulse 240 that also serves to gate the laser 216 to produce a laser pulse 242 that can serve as a pump pulse. The sample 210 can also be stimulated in different ways. The electron beam can be gated to produce a probe (electron beam) pulse 244 with variable delay $T_D$ with respect to the pump pulse. However, the electron beam need not be pulsed as temporal resolution is determined by the SPAD array 214A. Each element of the SPAD array 214A can produce output signals such as an output signal 246 that can include a representative detection event 247. As noted above, the laser 216 can operate at a fixed frequency and thus be used to time SPAD gating.

Example 3

Figure 3A:
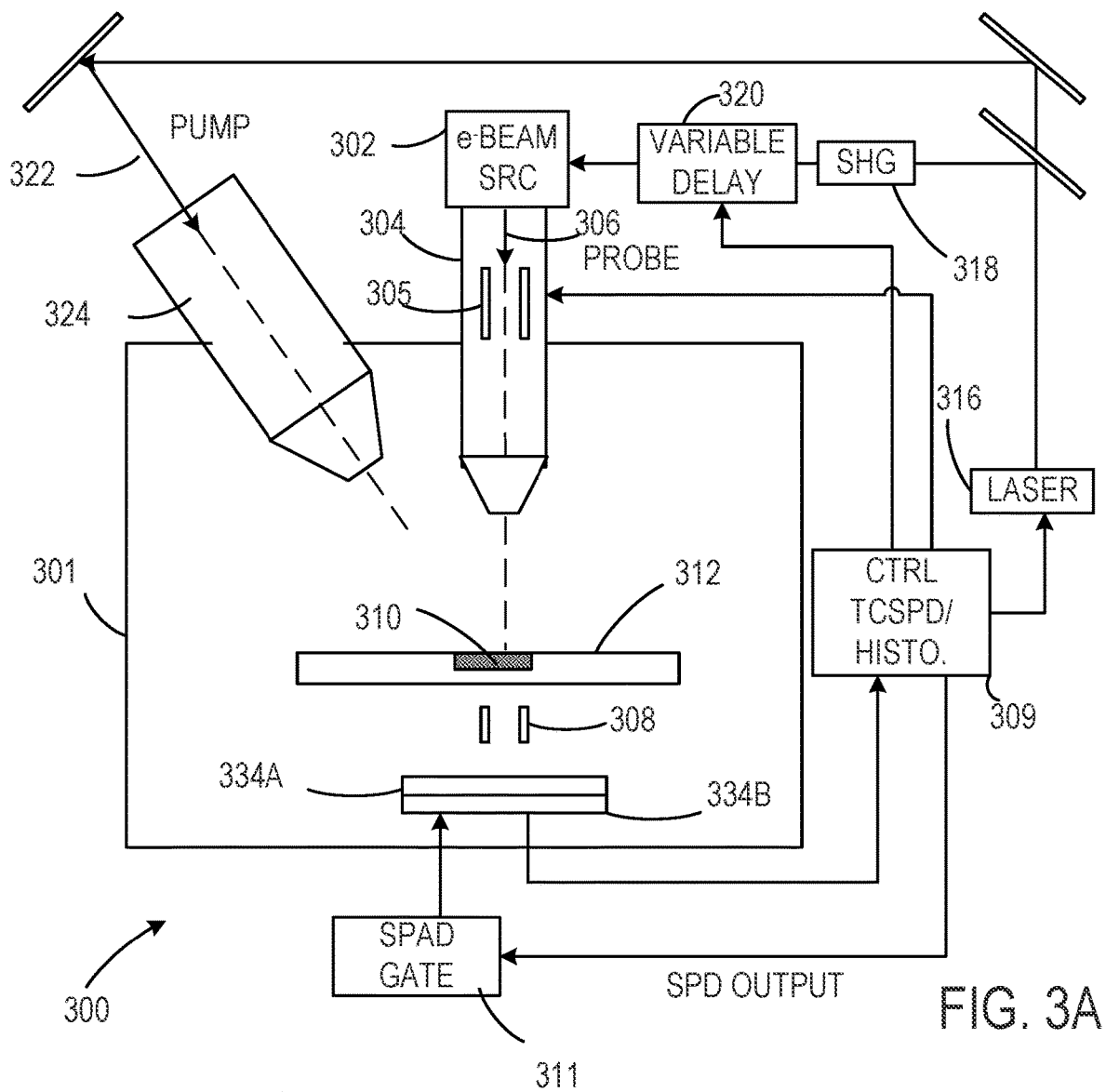
FIG. 3A illustrates a representative electron microscope system configured to use a pump beam, a probe electron beam generated in response to the pump beam, and a SPAD array.

Referring to FIG. 3A, a representative time-gated detection system 300 includes an electron beam source 302 and an electron beam optical column 304 having suitable lenses, deflectors such as deflector 305, and other electron-optical components that direct an electron beam 306 (a probe beam) to a sample 310 that can be situated on a stage 312. In some cases, a deflector 308 is situated to sweep the electron beam 306 after interaction with the sample 330 to different detector elements of a detector such as a single photon avalanche diode (SPAD) array 314A. The deflector 305 can be controlled to deflect the electron beam 306 so that the sample 310 is unexposed except at suitable times. This electron beam blanking can be used to reduce dose on the sample 310 and dose received by the SPAD array 314A, particularly during SPAD array recovery times. After interaction with the electron beam 306, a portion of the electron beam 306 is received by the SPAD array 314A. In other examples, other radiation responsive to the interaction such as secondary emission or X-radiation is detected alternatively or in addition to electron beam portions using one or more suitable detectors.

Figure 3B:
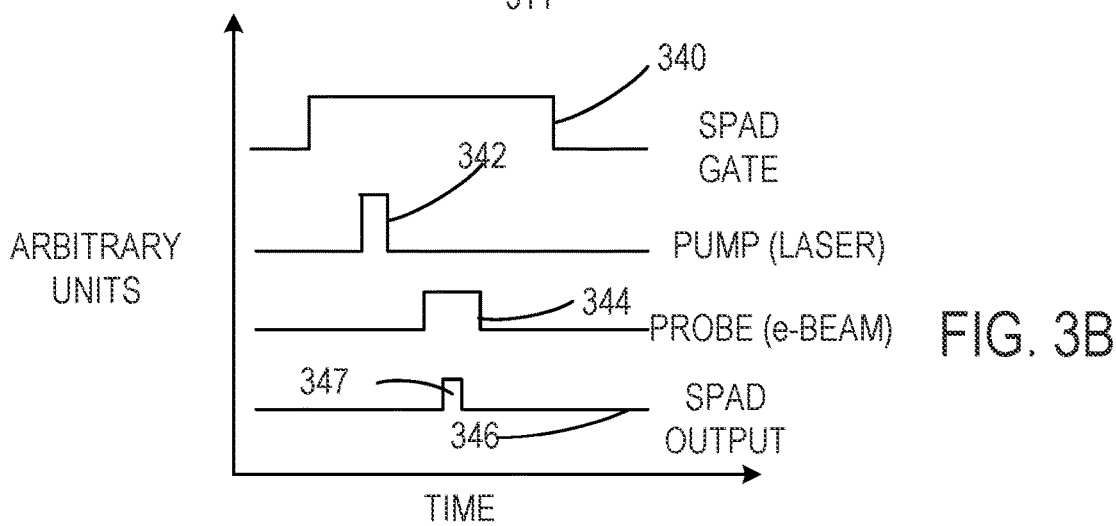
FIG. 3B is a representative timing diagram associated with the system of FIG. 3A.

The system 300 can be operated as follows. First, note that in conventional optical pump/probe systems using electron beam probes, a pulsed laser is used to produce a pump pulse that is directed to a sample and a portion of the pulsed laser output is used to generate an electron beam probe pulse that is directed to the sample with various delays between the pump and probe pulses. By varying the pump/probe delay, response of the sample to the pump can be measured with a slow detector. Using a sufficient number of pump/probe delays, the temporal response of the sample to the pump can be measured. By contrast, in systems such as the system 300, a detector (e.g., SPAD array 314A) is gated by a SPAD gate generator 311 to initiate data acquisition. As shown in FIG. 3B, the SPAD array 314A is gated to be in an on-state using a gating pulse 340 that also serves to gate the laser 316 to produce a laser pulse 342 that can serve as a pump pulse. The sample 310 can also be stimulated in different ways (i.e., without a laser pulse), although laser pulses are convenient for time-resolved measurements at short timescales. A portion of the pump pulse can be directed to the e-beam source 302 to produce a probe (electron beam) pulse 344. The SPAD array 314A can produce a plurality of output signals such as an output signal 346 that includes a detection event 347. Because the SPAD array 314A operates in Geiger mode, the amplitude of the output signal 346 is independent of signal amplitude but the times at which the detection event 347 is produced (referred to as "arrival times") for a series of probe pulses can be used generate a histogram of arrival times. This histogram can be used to obtain a temporal response of the sample to the probe pulses. Relative signal timings can be set electronically by a controller 309 and/or a variable optical pulse delay 320 that permits varying probe pulse timing.

The configuration of FIG. 3A is a representative example and in other examples, generation of a probe pulse is not based on the optical pump pulse. For example, the beam deflector 305 can be controlled to deflect the electron beam 306 until the pump pulse is applied. In this way, the SPAD detector array 314A receives reduced electron beam dose as compared with use of an unmodulated electron beam. In addition, blanking the electron beam 306 reduces electron pileup distortion that causes histograms produced with the SPAD array output signals to show response to the probe pulse with significantly reduced amplitude. Although not shown in FIG. 3B, after detection of an electron, a SPAD array element typically has a dead time that is typically between 30 ns and 1 μs so that response to the unblanked electron beam can increase deadtime and delay signal acquisition.

The controller 309 can produce time-correlation of SPAD detector array signals (time correlated single photon detection—TCSPD) and produce histograms for each element of SPAD detector array 314A. In some cases, some such processing is provided with an adjacent or integrated signal processing substrate 314B.

In another approach, the electron beam source 302 can be responsive to optical pulses from a laser 316 so that the electron beam 306 is a pulsed electron beam or includes a pulsed component. In some examples, electron beam pulses are produced by photoemission and a laser beam output can be frequency doubled at a second harmonic generator 318 to improve photoemission efficiency based on a work function of an electron emitter. In addition, a variable delay generator 320 can be provided to control relative timing of electron pulses with respect to optical pulses (i.e., pump pulses) in a laser beam 322 that is directed to the sample 310 via a light optical system 324. Electron beam blanking is generally not necessary as the electron beam can be pulsed. Electron beam and laser beam propagation to the sample 310 are situated within a vacuum enclosure 301.

Example 4. Stacked SPADs

SPADs can operate with high temporal resolution of 30 ps or better. In some examples, two SPAD-based detection wafers (referred to for convenience as a top and a middle layer) that include an array of SPAD elements (also referred to as pixels) are fixed to a third wafer (referred to for convenience as a bottom wafer) on which processing circuitry is defined. In some examples, processing circuitry is located elsewhere to avoid exposure to the electron beam. Because high energy electrons are not blocked by the upper detector, they can create free charge carriers in SPAD elements in both SPAD-based detection wafers. Therefore, a single electron can generate a detection event in corresponding SPAD elements in both SPAD-based detectors. A timing circuit can be used to time the detection event in each SPAD-based detector with accuracies of about 30 ps or less. By correlation based on the detection times, simultaneous detection events in the top and middle layers can be distinguished from noise events. The wafers can be coupled with copper-to-copper direct hybrid bonding and interconnected with Through-Silicon-Vias (TSVs) that permit 3D interconnection between layers.

Example 5. SPADs with Integrated Histogramming

SPADs and other single event detectors can produce large numbers of detection events that can be processed to determine temporal waveforms. This can require high speed data transfer and/or data storage of the detection events. In examples disclosed herein, SPAD arrays are operated in a so-called histogramming mode in which individual detection events are processed on-chip at each SPAD array or at each SPAD element to produce event histograms for each pixel. In this histograms, the bins correspond to electron arrival times relative to each gate or pump pulse. Pump-probe TEM measurements can be done in a stroboscopic mode in which a pump-probe sequence is repeated a large number of times to collect detection events for histogramming. Detection events can be acquired for predetermined time, to produce a sufficient number of detection events, or for other time intervals. Detection events are accumulated into per-element (per-pixel) histograms as the detection events are acquired to produce histograms of numbers of detection events in a plurality of time bins relative to a gating signal. After detection events are acquired and processed to produce histograms, the histograms can be transferred from the SPAD arrays so that total data transfer requirements are substantially reduced. Detection event data such as event times need not be transferred.

Example 6

With reference to FIG. 4A, a SPAD array system 400 includes a first SPAD array 402 defined on a first substrate 403 and a second SPAD array 404 defined on a second substrate 405. The SPAD arrays 402, 404 include respective SPAD elements such as representative SPAD elements 412, 414. As shown in FIG. 4A, the SPAD detector system 400 is typically situated to receive an electron beam or other particle beam propagating generally along a charged particle beam axis 416. The SPAD elements are arranged so that an electron that is directed to a SPAD element in the first SPAD array 402 is received by a corresponding SPAD element in the second SPAD array 404. For example, an electron that is detected by the SPAD element 412 can also be received and detected by the SPAD element 414. Unlike SPAD detection of optical signals, electrons are not absorbed in a SPAD element, but can propagate to be detected by multiple detectors.

In the example of FIG. 4A, a third substrate 406 is provided that can include electrical connections and circuit elements for some or all of the SPAD elements of the first and second SPAD arrays 402, 404. The third substrate 406 can be coupled to one or more external circuits such as control, bias, and clock circuitry 420 that control SPAD element bias and can provide output signals indicative of detection events at the SPAD elements. The external circuits can include a coincidence detector 418 that indicates simultaneous detection events in corresponding SPAD elements of the SPAD arrays 402, 404. As used herein, "simultaneous" detection events are detection events that occur with a predetermined time interval, generally corresponding to events that occur within time intervals that are typically less than 1 ns, 300 ps, 30 ps, 10 ps, or smaller. Coincidence detection can alternatively be provided in circuitry defined on the third substrate 406. Using coincidence detection, single noise events that could otherwise be mistaken for real signal events can be discarded. The coincidence detector 418 indicates electron detection only if both of the corresponding SPAD elements of the SPAD arrays 402, 404 indicate detection events within a selected time interval.

Coincidence detection, SPAD array bias, and other processing and control circuitry can be defined in the third substrate 406, In some cases, some circuit elements are defined generally in the first substrate 402 and the second substrate 404 or at, near, or in conjunction with the SPAD elements. In this example, the substrates 402, 404, 406 can be bonded to each other, with SPAD elements suitably aligned with respect to the axis 416.

Referring to FIG. 4B, a stacked SPAD array system 450 includes first and second SPAD arrays 452, 454 that are fixed with respect to each other with a frame 458. The frame 458 situates the SPAD arrays so that corresponding SPAD elements such as representative SPAD element 462, 464 are aligned along an axis 456. A circuit substrate 460 defining bias, control, coincidence detection or other circuit elements can be secured by the frame 458 as well. Some or all such circuitry can be provided with an external SPAD control system 470. The SPAD arrays 452, 454 and the circuit substrate 460 are spaced apart by respective gaps 474, 475.

Although not shown in FIGS. 4A-4B, event histogramming can be performed using circuit/processing elements situated on some or all substrates or externally provided.

Example 7

Figure 5:
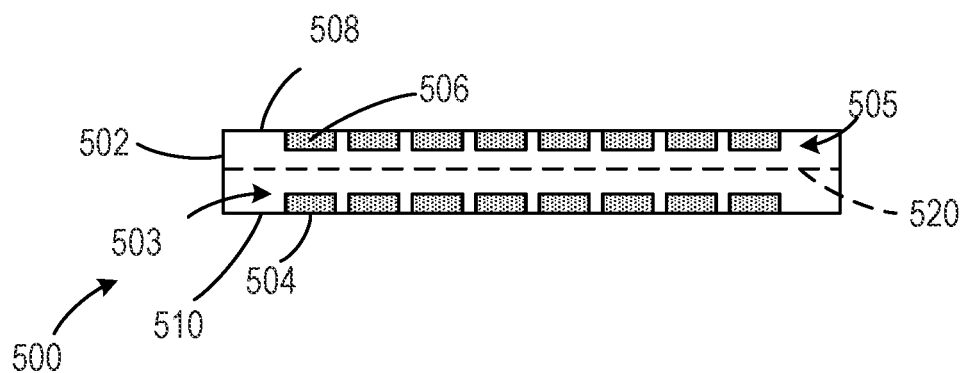
FIG. 5 is a sectional view of a stacked SPAD array that includes first and second SPAD arrays that are defined on opposing major surfaces of a common substrate.

With reference to FIG. 5, stacked SPAD array 500 includes corresponding SPAD arrays 503, 505 that include SPAD elements such as representative SPAD elements 504, 506 defined on respective surfaces 508, 510 of a substrate 502. Alternatively, separate substrates can be secured to each other as indicated at 520.

Example 8

Figure 6:
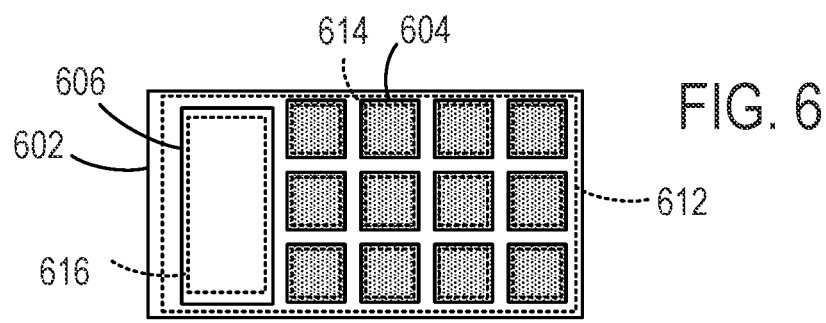
FIG. 6 illustrates a two-dimensional stacked SPAD array defined on first and second substrates that include associated substrate circuit regions.

Referring to FIG. 6, a first two-dimensional stacked SPAD array includes a two-dimensional array of SPAD elements such as representative element 604 defined on a first substrate 602. In addition, SPAD control circuitry can be provided in a substrate region 606. A corresponding second two-dimensional stacked SPAD array (shown in dashed lines) can be defined on a second substrate 612 and can include SPAD elements such as representative SPAD element 614 that corresponds to SPAD element 604. The second substrate 612 also includes a substrate region 616 (shown in a dashed line) that can be provided with control, bias, electrical connections, and other circuitry. The first and second two-dimensional stacked SPAD arrays are coupled to external analog and/or digital circuitry that can include amplifiers, signal processors, filters, counters, coincidence circuits, and processors that receive coincident events and produce histograms. In other examples, such circuitry is provided in one or more of the substrate regions 606, 616.

Example 9

Figure 7:
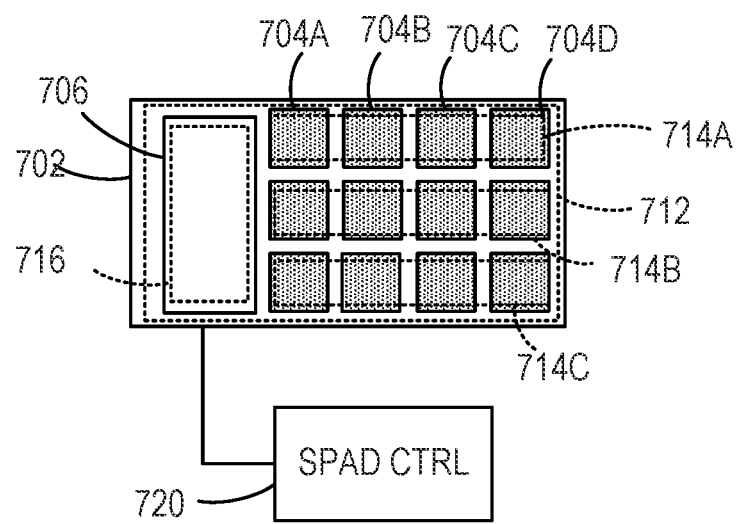
FIG. 7 illustrates a two-dimensional SPAD array defined on a first substrate and stacked in alignment with a one-dimensional SPAD array defined on a second substrate.

Referring to FIG. 7, a dual SPAD system includes a two-dimensional array of SPAD elements such as representative elements 704A-704D defined on a first substrate 702. In addition, SPAD control circuitry can be provided in a substrate region 706. A one-dimensional SPAD array (shown in dashed lines) can be defined on a second substrate 712 and can include SPAD elements such as representative SPAD elements 714A-714C. The SPAD element 714A is associated with SPAD elements 704A-704D. In this example, the SPAD elements 714A-714C are associated with multiple SPAD elements of the two dimensional SPAD array. While the one-dimensional array does not confirm event coincidences with the same spatial precision as in stacked two-dimensional arrays, it can discriminate against noise events. The second substrate 712 also includes a substrate region 716 that can be provided with control, bias, electrical connections, and other circuitry. The SPAD arrays are stacked and can be coupled to external analog and/or digital circuitry that can include amplifiers, signal processors, filters, counters, coincidence circuits, and processor that receive coincident events and produce histograms as shown at 720. Typically, with such a SPAD system, events detected in the two-dimensional array are confirmed by coincidence detection in the one-dimensional array and these detected events are used in histogramming. Stacked SPAD arrays can have different numbers and sized of SPAD elements. For example, a first array can have multiple elements and a second array have fewer elements, including only a single element that is used to establish coincidence but matching arrays can be convenient.

Example 10

Figure 8:
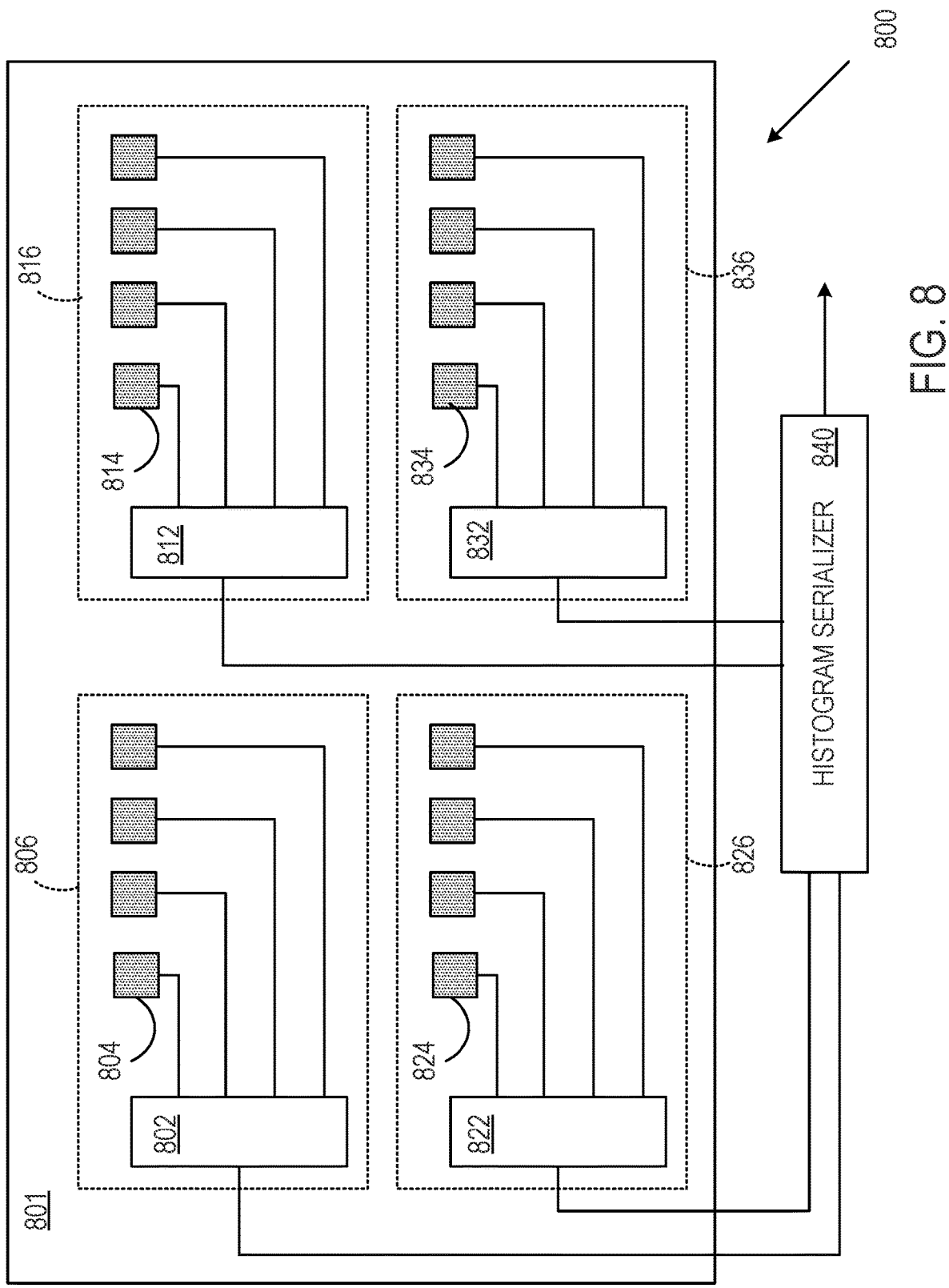
FIG. 8 illustrates a two dimensional SPAD array comprising a plurality of sub-arrays that include respective circuit areas in which detection event circuitry is situated.

Referring to FIG. 8, a SPAD array 800 is defined on a substrate 801 and includes respective SPAD sub-arrays 806, 816, 826, 836 that include SPAD elements such as representative SPAD elements 804, 814, 824, 834 and control circuitry 802, 812, 822, 832. Histogram data is provided to a serializer 840 for transmission from the SPAD array 800 but histogram data can be accumulated at the substrate 801.

Example 11

Figure 9:
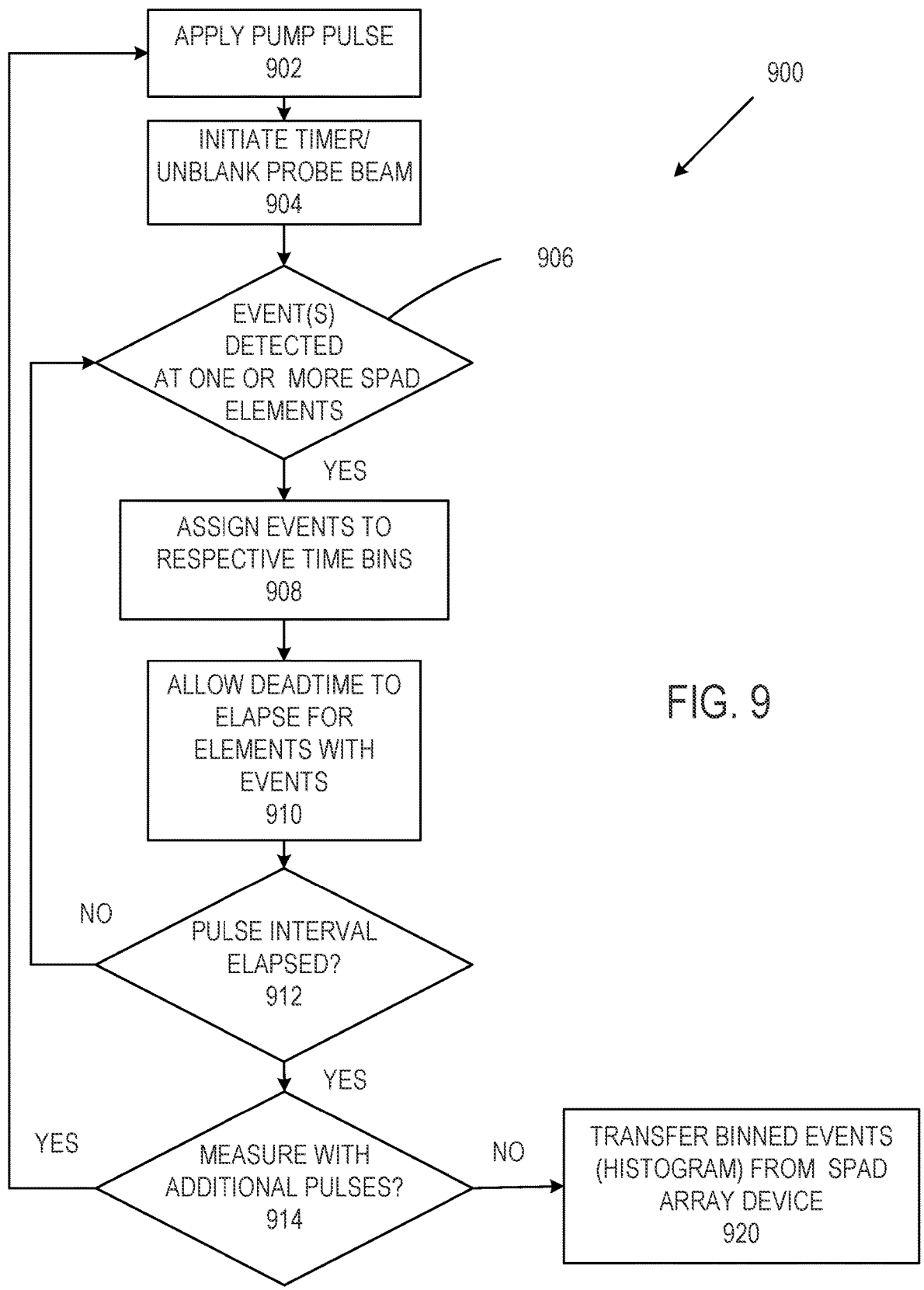
FIG. 9 illustrates a representative method in which sample electron beam modulation in response to a pump pulse is detected using a SPAD array to produce time of arrival histograms for some or all SPAD elements of the SPAD array.

Referring to FIG. 9, a representative method 900 includes applying a pump pulse to a sample at 902 and initiating a timer at 904. Typically, a probe beam is unblanked as well but unblanking can be provided prior to or after a pump pulse with a time increment or time delay that can be fixed or variable. At 906, events are detected at one or more SPAD elements and assigned to time bins at 908. At 910, a SPAD deadtime or recovery time can be allowed to elapse and at 912 it is determined if a pulse interval, typically a pulse period corresponding to pump pulse repetition rate has elapsed. If not, the method 900 returns to 906 for detection of additional events associated with the pump pulse. If the pulse interval has elapsed, at 914 it is determined if additional pump pulses are to be applied and measured, and if so, a pump pulse is applied again at 902. If additional pulses are not to be used, a histogram of time binned event counts is provided, in some examples, directly from a SPAD detector assembly such as that of FIG. 4A that includes a suitable substrate on which processing circuitry is defined although histograms can be produced with processing external to the SPAD array. Histograms can be read out when a certain number of counts is reached in one or more bins, after a total number of counts is reached, or at a fixed rate (independent of the number of counts).

Example 12

Figure 10:
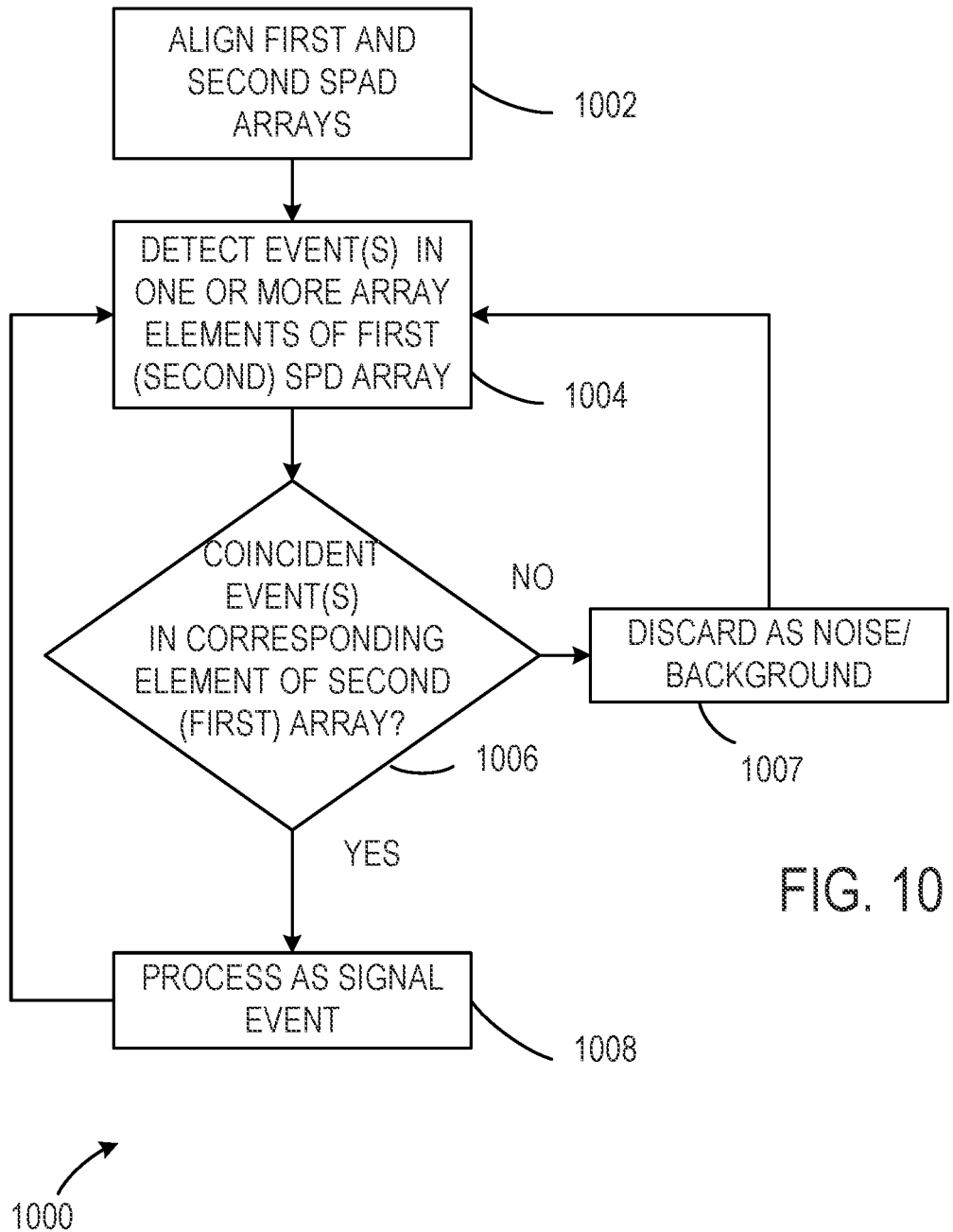
FIG. 10 illustrates a representative method of using stacked SPAD arrays.

Referring to FIG. 10, a representative method 1000 includes aligning first and second SPAD arrays at 1002. At 1004, events are detected at one or more array elements of the first and second SPAD arrays. At 1006, the detected events are evaluated to detect coincident events in corresponding elements of the first and second SPAD arrays. If there are coincident events, these are identified as true detection events and added to an event histogram at 1008. Alternatively, lacking coincidence, these are identified as noise and discarded at 1007. In typical examples, a number of such noise events is maintained and each additional noise event is associated with incrementing a noise event counter. Coincidence can be established as events are received, or events can be processed after data gathering if suitable event time stamps are recorded to permit determination of coincidence. As shown in FIG. 10, after an event is processed (or during event processing), the method continues to detect events. In examples, events are associated with electron beam modulation in response to a pump beam applied to a sample. The electron beam can be a continuous beam, but to lower sample dose and reduce electron pile-up, the electron beam can be unblanked during time period of interest, generally for time intervals following application of a pump beam to a sample.

General Terminology

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

In view of the many possible embodiments to which the principles of the disclosed technology may be applied, it should be recognized that the illustrated embodiments are only preferred examples and should not be taken as limiting the scope of the disclosure.

We claim:

1. A charged particle (CP) detector, comprising:
a first single photon detector (SPD) array;
a second SPD array, aligned with respect to the first SPD array along a CP beam axis; and
a coincidence detector secured to one of the first SPD array and the second SPD array and operable to indicate detection events corresponding to detection of a charged-particle in corresponding SPD array elements of the first SPD array and the second SPD array within a predetermined time window.

2. The CP detector of claim 1, wherein the first SPD array and the second SPD array are defined on a first substrate and a second substrate, respectively, and the first substrate is fixed with respect to the second substrate.

3. The CP detector of claim 2, wherein the first substrate and the second substrate are semiconductor substrates in which SPD array elements of the first SPD array and the second SPD array, respectively, are defined, and the first SPD and the second SPD are single photon avalanche detectors (SPADs).

4. The CP detector of claim 2, wherein the coincidence detector includes a corresponding coincidence detector element for each pair of corresponding SPD array elements of the first SPD array and the second SPD array.

5. The CP detector of claim 4, wherein the coincidence detector is defined on a third substrate that is secured to at least one of the first substrate and the second substrate.

6. The CP detector of claim 2, the first SPD array and the second SPD array include different numbers of SPD elements, wherein the coincidence detector is configured to indicate detection events in response to detection of a charged particle in at least one SPD element of the first SPD array and at least one SPD element of the second SPD array.

7. The CP detector of claim 1, further comprising:
a frame situated to align the first SPD array and the second SPD array; and
at least one spacer situated to define a separation of the first SPD array and the second SPD array.

8. The CP detector of claim 1, wherein the first SPD array and the second SPD array are defined on a first and a second substrate, respectively, and the first substrate is fixed with respect to the second substrate, and further comprising:
a third substrate coupled to the first SPD array and the second SPD array to receive detection events from the first SPD array and the second SPD array and produce a time stamp associated with each received detection event for a plurality of corresponding SPD array elements of the first SPD array and the second SPD array.

9. The CP detector of claim 1, wherein the first SPD array and the second SPD array are defined on a first and a second substrate, respectively, and the first substrate is fixed with respect to the second substrate, and further comprising:
a third substrate coupled to the first SPD array and the second SPD array to receive detection events from the first SPD array and the second SPD array and produce histograms of detection events for a plurality of corresponding SPD array elements of the first SPD array and the second SPD array.

10. The CP detector of claim 9, wherein the first SPD and the SPD arrays are single photon avalanched detector (SPAD) arrays.

11. The CP detector of claim 10, wherein the first, second, and third substrates are fixed with respect to each other.

12. A method, comprising:
in an electron microscope,
directing an electron beam to a sample;
detecting events based on a modulation of the electron beam in response to corresponding pump pulses directed to the sample in a first single photon detector (SPD) array; and
associating the detected events with time bins corresponding to elapsed times from application of the corresponding pump beam pulses.

13. The method of claim 12, further comprising forming a histogram of numbers of the detected events.

14. The method of claim 12, further comprising repetitively blanking the electron beam for at least a portion of time intervals between corresponding pump pulses.

15. The method of claim 14, wherein the electron beam is unblanked based on application of the pump pulses.

16. The method of claim 15, wherein the electron beam is unblanked at a fixed time delay with respect to the pump pulses.

17. The method of claim 15, wherein the pump pulses and the electron beam blanking are applied at a fixed repetition frequency.

18. The method of claim 17, wherein the fixed repetition frequency is between 100 Hz and 300 MHz and the electron beam is repetitively blanked for an interval of at least 95% of a fixed period associated with the fixed repetition frequency.

19. The method of claim 12, wherein the first SPD array is a single photon avalanched detector (SPAD) array, further comprising:
with a second SPAD array secured to the first SPAD array, determining if coincident events are detected corresponding to the events detected with the first SPAD array; and
forming a histogram based on the coincident events, wherein a time bin for each coincident event is based on a time with respect to an associated pump beam pulse.

20. The method of claim 19, wherein the first SPAD array and the second SPAD array are defined on a first and a second substrate, respectively, and the first substrate is fixed with respect to the second substrate, and a third substrate coupled to the first SPAD array and the second SPAD array is operable to produce histograms of detection events for a plurality of corresponding SPAD array elements of the first SPAD array and the second SPAD array.

* * * * *